(12) United States Patent
Aaltonen (10) Patent No.: US 11,139,736 B2
(45) Date of Patent: Oct. 5, 2021

(54) CHARGE-PUMP CIRCUITRY AND A METHOD FOR HIGH VOLTAGE GENERATION WITH IMPROVED PSRR

(71) Applicant: MURATA MANUFACTURING CO., LTD., Nagaokakyo (JP)

(72) Inventor: Lasse Aaltonen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/098,726

(22) Filed: Nov. 16, 2020

(65) Prior Publication Data

US 2021/0159786 A1    May 27, 2021

(30) Foreign Application Priority Data

Nov. 21, 2019   (FI) .................................. 20195998

(51) Int. Cl.
*H02M 3/07*    (2006.01)
(52) U.S. Cl.
CPC ............ *H02M 3/073* (2013.01); *H02M 3/075* (2021.05)
(58) Field of Classification Search
None
See application file for complete search history.

(56) References Cited

U.S. PATENT DOCUMENTS

| 7,573,318 B2 * | 8/2009 | Kim ..................... H02M 3/07 327/535 |
| 7,639,067 B1 | 12/2009 | Perisetty |
| 7,724,072 B2 * | 5/2010 | Baek ..................... G11C 5/143 327/536 |
| 7,982,530 B2 * | 7/2011 | Byeon ................... H02M 3/073 327/536 |

(Continued)

FOREIGN PATENT DOCUMENTS

EP    2 744 091 A1    6/2014

OTHER PUBLICATIONS

Finnish Search Report dated May 18, 2020 corresponding to Finnish Patent Application No. 20195998.

(Continued)

*Primary Examiner* — Thomas J. Hiltunen
(74) *Attorney, Agent, or Firm* — Squire Patton Boggs (US) LLP (57) ABSTRACT

A high voltage generating circuitry includes a charge-pump and control loop; the control loop includes a voltage divider which receives a high voltage and provides a divided high voltage output. A first circuit element provides a first voltage difference signal. A controller generates a feedback signal based on the first voltage difference signal. An oscillator generates clock signals for operating the charge-pump circuitry, with the frequency of the clock signals being controlled with a control signal. A feedforward path with a second circuit element combines a second reference voltage and a second voltage generated by inverting the supply (Continued)

voltage for obtaining a second voltage difference signal. A third circuit element generates a feedforward compensation signal inversely proportional to a voltage difference between the supply voltage and the second reference voltage. A fourth circuit element generates the control signal by summing the feedback signal and the feedforward compensation signal.

11 Claims, 5 Drawing Sheets

(56) References Cited

U.S. PATENT DOCUMENTS

| | | | | |
|---|---|---|---|---|
| 8,330,436 | B2* | 12/2012 | Oraw | H02M 3/07 323/268 |
| 8,493,133 | B2* | 7/2013 | Byeon | G05F 1/575 327/536 |
| 8,896,366 | B2* | 11/2014 | Kang | G05F 5/00 327/535 |
| 2003/0174524 | A1 | 9/2003 | Botker et al. | |
| 2011/0221513 | A1 | 9/2011 | Fujisawa et al. | |
| 2014/0253190 | A1 | 9/2014 | Chen et al. | |
| 2016/0103174 | A1 | 4/2016 | Aaltonen et al. | |

OTHER PUBLICATIONS

Lasse Aaltonen et al.: "On-Chip Charge-Pump with Continuous Frequency Regulation for Precision High-Voltage Generation," Proceedings of the 2009 Ph.D. Research in Microelectronics and Electronics (PRIME 2009), Cork, Ireland, Jul. 12-17, 2009.

European Search Report dated Mar. 31, 2021 corresponding to European Patent Application No. 20204870.

Mir Mohammad Navidi et al., "A regulated charge pump for injecting floating-gate transistors," 2017 IEEE International Symposium on Circuits and Systems (ISCAS), IEEE, May 28, 2017, pp. 1-4, XP033156480.

M. El-Nozahi et al., "High PSR Low Drop-Out Regulator with Feed-Forward Ripple Cancellation Technique," IEEE Journal of Solid-State Circuits, IEEE, vol. 45, No. 3, Mar. 1, 2010, pp. 565-577, XP011303480.

* cited by examiner

PRIOR ART

Figure 1

PRIOR ART

CHARGE-PUMP CIRCUITRY AND A METHOD FOR HIGH VOLTAGE GENERATION WITH IMPROVED PSRR

FIELD

The present disclosure relates to an apparatus and a method related to high voltage generation on an integrated circuit, IC, using a charge-pump, CP. More particularly, the disclosure relates to circuitry and a method for generating high voltage, HV, with charge-pump, wherein the circuitry comprises a control loop and a feedforward path configured to improve efficiency and power supply rejection ratio, PSRR.

BACKGROUND

Micro-Electro-Mechanical Systems or MEMS can be defined as micro-scale mechanical and electro-mechanical systems where at least some elements have a mechanical functionality. MEMS structures can be applied to quickly and accurately detect very small changes in physical properties.

Generation of high voltages locally is commonly required in MEMS interfacing integrated circuits. For example, a high voltage may be needed for driving one or more elements of the MEMS structure into an oscillating motion. Availability of an accurate high voltage facilitates generation of accurate motion or motions needed for accurate measurements. On the other hand, an accurate high voltage may also facilitate accuracy of detection in capacitive sensors, since it enables higher currents to be provided from capacitive sensor elements. An external high voltage is usually neither available nor allowed.

A commonly known method for creating an on-chip high voltage is utilizing charge-pump, CP. There are several requirements that should be fulfilled to the best extent for a feasible charge-pump circuitry in an integrated chip environment. Power and/or current consumption of the charge-pump should be as low as possible, which determines a requirement of good efficiency for the circuitry. Cost of the circuitry should be minimized, which translates into a requirement of minimizing die area needed for the circuitry. Further, the high voltage generated with the charge-pump circuitry should also be as free from disturbances as possible. Disturbance free operation also requires defining a target for the power supply rejection ratio, PSRR, of the circuitry. However, good PSRR is by nature conflicting with the optimization of die area and efficiency.

A high voltage output, HV, generated by an ideal charge pump may be expressed with a function HV=VDD*(N+1), where VDD is the supply voltage and N is number of charge-pump stages. Known techniques for improving PSRR, such as pre-regulation of supply voltage of the charge-pump lowers efficiency and increases die area. Pre-regulation of a power source that is external of the IC typically limits range of the supply voltage available. Thus, although pre-regulation effectively removes effects of ripple in the supply voltage and consequently from the high voltage at the charge-pump output, it also reduces available range of supply voltage by limiting maximum available supply voltage value. Therefore, an increased amount of charge-pump stages N is required for compensating smaller range of the supply voltage, which decreases efficiency and increases die area.

DESCRIPTION OF THE RELATED ART

Publication "On-chip charge-pump with continuous frequency regulation for precision high voltage generation" by Lasse Aaltonen and Kari Halonen, published in Proceedings of the 2009 Ph.D. Research in Microelectronics and Electronics (PRIME 2009), Cork, Ireland 12-17 Jul. 2009 discloses a technique for closed-loop control of a charge-pump using a voltage-controlled oscillator, VCO.

Figure 1:
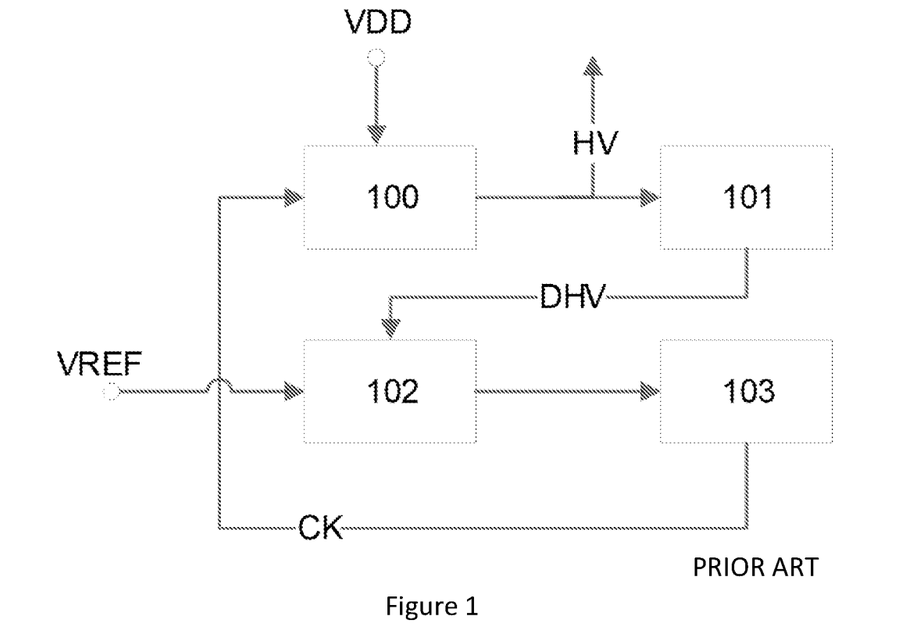
FIG. 1 is a schematic of a charge-pump circuitry, in which the charge-pump is regulated with a control loop as known in the art.

The FIG. 1 shows a block diagram of a regulated charge-pump circuitry as known in the art, in which a feedback control loop (101, 102, 103) controlling operation of the charge-pump (100) is implemented essentially in continuous time in effort to minimize low-frequency ripple in the high voltage at the charge-pump output in response to active regulation. The high voltage charge-pump (100) may be implemented as any known type of charge-pump, for example a Dickson-type pump. The charge-pump (100) receives at its input a supply voltage (VDD) and provides at its output the wanted high voltage (HV). A voltage divider (101) divides the high voltage (HV) and provides a divided high voltage (DHV) as an input to a controller circuitry (102). Voltage division enables using voltages in the control loop that are lower than the high voltage. As a simple example, the voltage divider (101) may be a resistive divider with two resistors connected in series. A high resistance of the voltage divider (101) is beneficial, since a high load resistance at the output of the charge-pump facilitates a small current, and thus small additional load to the charge-pump due to the control loop. Preferably, current in the control loop should only be a minor share of the total load current of the charge-pump. Selection of the resistances in the voltage divider (101) is a design parameter that depends for example on whether the charge-pump is entirely integrated with limited available load current at the output of the charge-pump, or the charge-pump is provided with external capacitors, which may provide higher available load current at the output of the charge-pump. The controller circuitry (102) compares the divided high voltage (DHV) with a voltage reference voltage (VREF). Difference between the divided high voltage (DHV) and the reference voltage (VREF) is fed to a voltage-controlled oscillator, VCO (103). Difference voltage adjusts operating frequency of the VCO (103), which controls pumping frequency of the charge-pump by providing two clock signals (CK) in mutually opposite phases for the charge-pump (100).

The feedback control loop illustrated in the FIG. 1 is, however, too slow for ensuring a ripple free high voltage (HV) at the output of the charge-pump (100), when there is higher frequency AC ripple in the supply voltage (VDD). For example, parasitic poles of the response function of the feedback control loop may limit achievable loop gain on frequencies between about 10 kHz and 100 kHz, which consequently disables achieving sufficiently high loop gain for improving PSRR by using the feedback control loop only.

Figure 2:
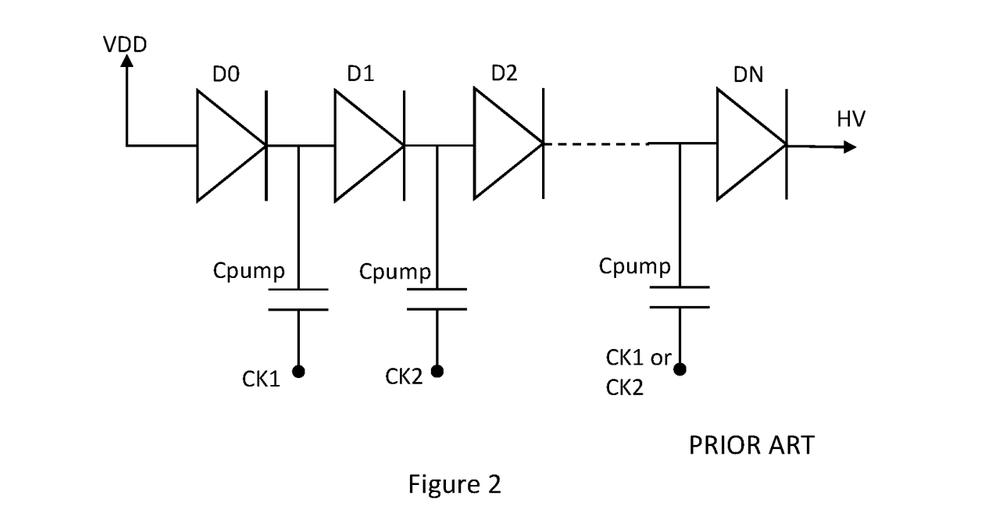
FIG. 2 illustrates a Dickson-type charge-pump.

FIG. 2 illustrates basic structure of a Dickson-type charge-pump implemented with diodes (D0, D1, D2, . . . DN) as known in the art. Two clock signals (CK1, CK2) in mutually opposite phases are fed to the pump capacitors (Cpump) for controlling switching in a two-stage cycle. A diode (D1, D2, D3, . . . , DN) and a respective capacitor (Cpump) form a stage of the charge-pump. In an ideal charge-pump, when omitting the forward bias threshold voltage of the diodes and other parasitic properties of diode stages, each stage can increase the output voltage by the output voltage VDD when the output is not loaded.

Figure 3:
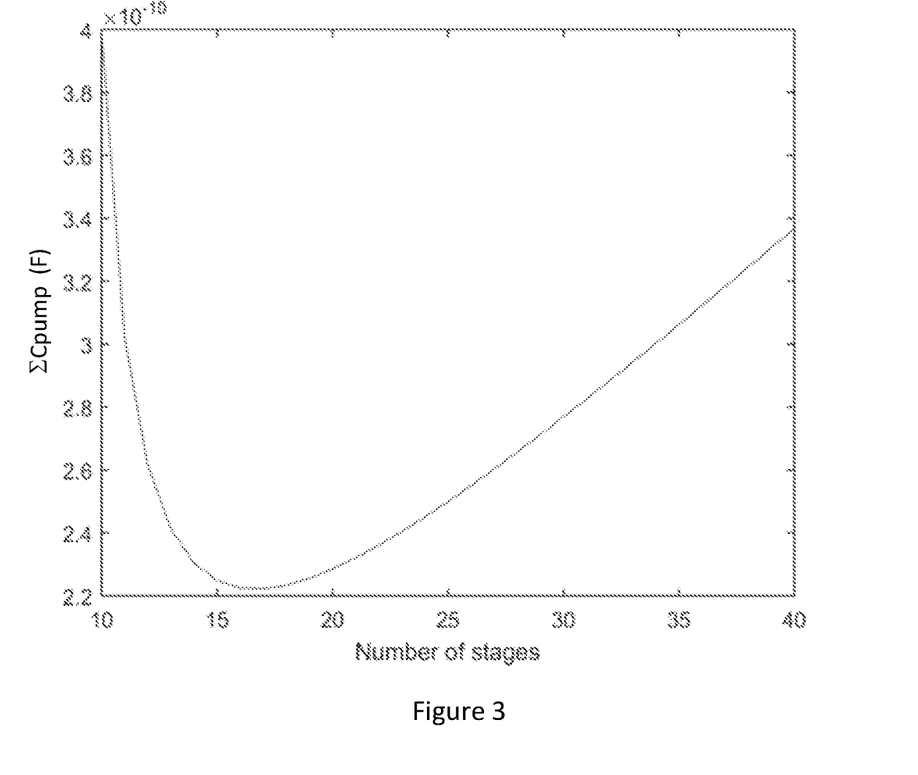
FIG. 3 shows total capacitance of a charge-pump as a function of number of stages of the charge-pump.

FIG. 3 illustrates total charge-pump capacitance Cpump of an exemplary ideal charge-pump as a function of number of stages of the charge-pump. Although all active and passive circuitry affects die area requirements of the charge-pump, total charge-pump capacitance ΣCpump is a dominating factor in die area consumption due to relatively large die area required by capacitors. Thus, a value that is at or near minimum for total capacitance requirement is preferred for optimizing die area required by the charge-pump. In the non-limiting, exemplary function shown in the FIG. 3, supply voltage (VDD) is 3V, high voltage output (HV) is 28V, load current is 200 µA, and pump clock (CK1, CK2) frequency is 10 MHz. A clear minimum required total charge-pump capacitance ΣCpump can be attained in this example with a charge-pump having about 17 stages. As understood by a skilled person, the optimum number of stages is dependent on design parameters including at least the supply voltage, the needed high voltage and the clock frequency.

Above-disclosed continuous time feedback and optimization of number of stages of the charge-pump can facilitate a good solution for optimizing current consumption and die area of the charge-pump itself, but they do not provide a solution for effective PSRR.

Thus, a solution is needed that enables improvement of PSRR, in other words suppression of ripple in the high voltage (HV) due to ripple in the supply voltage (VDD), without significant negative effects on neither die area nor efficiency of the circuitry.

SUMMARY

An object is to provide a method and apparatus so as to solve the problem of improved power supply rejection ratio in an on-chip high voltage generating circuitry that utilizes charge-pump. The objects of the present invention are achieved with an apparatus according to the claim 1. The objects of the present invention are further achieved with a method according to the independent method claim.

It is to be understood that the apparatus is configured to perform the corresponding method, although in some examples only the apparatus or only the method is described.

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

The preferred embodiments of the invention are disclosed in the dependent claims.

According to a first aspect, a high voltage generating circuitry is provided, comprising a charge-pump configured to generate a high voltage based on a supply voltage and to provide the high voltage at its output, and a control loop configured to control operation the charge-pump. The control loop comprises a voltage divider configured to receive at its input the high voltage and to provide at its output a divided high voltage, a first circuit element configured to provide a first voltage difference signal generated on basis of a comparison between a first reference voltage and the divided high voltage, a controller configured to generate a feedback signal on basis of the first voltage difference signal, and a voltage- or current-controlled oscillator, referred to as the oscillator, configured to generate clock signals for operating the charge-pump circuitry. Frequency of said clock signals generated by the oscillator is configured to be controlled with a control signal. The control loop further comprises a feedforward path comprising a second circuit element configured to combine a second reference voltage and a second voltage generated by inverting the supply voltage for obtaining a second voltage difference signal, a third circuit element configured to generate, on basis of the second voltage difference signal, a feedforward compensation signal that is inversely proportional to a voltage difference between the supply voltage and the second reference voltage, and a fourth circuit element configured to generate the control signal by summing the feedback signal and the feedforward compensation signal.

According to a second aspect, the oscillator is a current-controlled oscillator, and the third circuit element is a first transconductance element configured to generate the feedforward compensation signal by transforming the second voltage difference signal from a voltage signal into a current signal. The control loop further comprises a second transconductance element configured to transform the feedback signal from a voltage signal into a current signal.

According to a third aspect, the oscillator is a voltage-controlled oscillator, and the third circuit element is a first scaling element configured to generate the feedforward compensation signal by scaling the second voltage difference signal.

According to a fourth aspect, the oscillator is implemented as a relaxation oscillator with a hysteresis dependent on the supply voltage. A frequency of the oscillator is configured to increase due to the hysteresis in response to a decrease in the supply voltage, and the frequency of the oscillator is configured to decrease due to the hysteresis in response to an increase in the supply voltage.

According to a fifth aspect, an integrated circuit is provided comprising the high voltage generating circuitry according to any of the above aspects.

According to a sixth aspect, the integrated circuit is configured to provide the high voltage for a MEMS circuit.

According to a first method aspect, a method for controlling a high voltage generating circuitry is provided. The method comprises generating, by a charge-pump, a high voltage based on a supply voltage, providing the high voltage at the output of the charge-pump, and controlling operation of the charge-pump by a control loop. The controlling comprises steps of providing a divided high voltage generated on basis of the high voltage, obtaining a first voltage difference signal on basis of a comparison between a first reference voltage and the divided high voltage, generating a feedback signal on basis of the first voltage difference signal, and generating, by a voltage or current-controlled oscillator, referred to as the oscillator, clock signals for operating the charge-pump circuitry. Frequency of said clock signals generated by the oscillator is configured to be controlled with a control signal. The method further comprises obtaining a second voltage difference signal by combining a second reference voltage and an inverted supply voltage, generating, on basis of the second voltage difference signal, a feedforward compensation signal that is inversely proportional to a voltage difference between the supply voltage and the second reference voltage, and generating the control signal by summing the feedback signal and the feedforward compensation signal.

According to a second method aspect, the oscillator is a current-controlled oscillator, and the method further comprises transforming the feedback signal from a voltage signal into a current signal and generating the feedforward compensation signal by transforming the second voltage difference signal into a current signal.

According to a third method aspect, the oscillator is a voltage-controlled oscillator, and the method further comprises providing the feedback signal as a voltage signal, and generating the feedforward compensation signal by scaling the second voltage difference signal.

According to a fourth method aspect, the method further comprises controlling hysteresis of the oscillator implemented as a relaxation oscillator with the supply voltage. The hysteresis of the relaxation oscillation is dependent on the supply voltage, such that the frequency of the oscillator is increased due to the hysteresis in response to a decrease in the supply voltage, and the frequency of the oscillator is decreased due to the hysteresis in response to an increase in the supply voltage.

According to a fifth method aspect, the method according to any of above method claim is performed by an integrated circuit.

The present invention is based on the idea of introducing a feedforward compensation signal in the charge-pump control loop, which feedforward compensation signal is inversely proportional to changes of the supply voltage (VDD). The feedforward compensation signal adjusts the clock frequency of an oscillator providing clock signals to the charge-pump such that a change in the clock signals due to the feedforward compensation signal causes a change in the high voltage generated by the charge-pump that is opposite to the effect of the respective change of the supply voltage (VDD) to the high voltage. In other words, the additional feedforward path is configured to adjust the frequency of the clock signals provided to the charge-pump by the voltage or current-controlled oscillator on basis of changes in the supply voltage, such that a change in the high voltage caused by the change of the clock frequency of the charge-pump due to the change of the feedforward compensation signal fed into the oscillator has inverted polarity in comparison to a change in the high voltage caused by the respective change of the supply voltage at the charge-pump.

The present invention has the advantage that it enables improvement in the power supply rejection ratio, PSRR, of a high voltage generating circuitry at wide range of frequencies, without significantly decreasing efficiency of the charge-pump circuitry nor increasing die area required by the charge-pump circuitry.

BRIEF DESCRIPTION OF THE DRAWINGS

In the following the invention will be described in greater detail, in connection with preferred embodiments, with reference to the attached drawings, in which.

DETAILED DESCRIPTION

Figure 4:
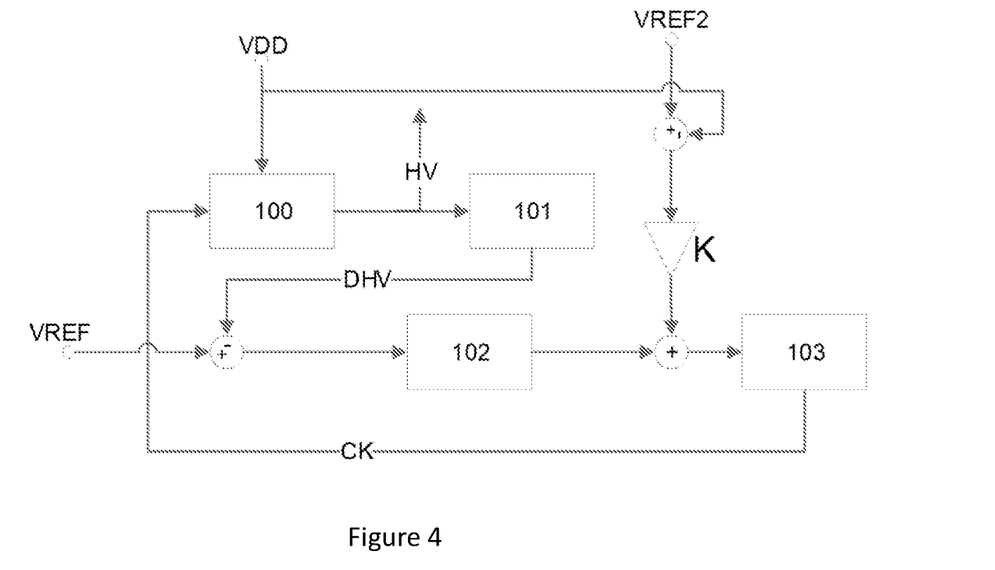
FIG. 4 shows a first embodiment of the charge-pump circuitry.

FIG. 4 illustrates a high-level schematic of a charge-pump circuitry according to a first embodiment.

In comparison to the prior art charge-pump control loop solution shown in the FIG. 1, a feedforward path has been added in the control loop in addition to the feedback control loop. In the feedback loop, the divided high voltage (DVH) is compared to a first reference voltage (VREF) such that deviation of the divided high voltage (DVH) with inverted polarity is summed with the first reference voltage (VREF). The feedforward path provides a feedforward compensation signal dependent on the difference between the supply voltage (VDD) and a second reference voltage (VREF2) to the control input of the voltage-controlled oscillator, VCO (103). The supply voltage (VDD) is compared to the second reference voltage (VREF2) such that the supply voltage (VDD) with inverted polarity is summed with the second reference voltage (VREF2). The resulting signal thus indicates a voltage difference between the supply voltage (VDD) and the second reference voltage (VREF2), but with inverted polarity: if the supply voltage (VDD) is higher than the second reference voltage, comparison results to a negative voltage and if the supply voltage (VDD) is lower than the second reference voltage, comparison results to a positive voltage. A scaling element (K) enables scaling the feedforward compensation signal before it is summed with a feedback signal provided by the controller (101) for generating a control signal for controlling operation of the VCO (103).

As a result, the feedforward compensation signal affects the VCO (103) frequency as part of the control signal, such that the effect of the feedforward compensation signal has inverted polarity in comparison to how the supply voltage (VDD) affects the charge-pump (100) properties and the generated high voltage (HV). Thus, any ripple or other variation in the supply voltage (VDD) is taken into account in the VCO (103) frequency and thus in the charge-pump (100) clock (CK) frequency. Depending on implementation, one or more filters may be added in the feedforward path before or after the scaling element (K) for limiting the frequency range of the feedforward path.

The control loop comprising the feedforward path as implemented is capable of handling a broad range of ripple frequencies. For example, it may be able to handle supply ripple with frequency ranging from about 0 Hz up to frequencies approaching mean VCO operating frequency. It is feasible to design the feedback loop to be as efficient in closed-loop regulation as possible so that remaining error after feedforward cancelling becomes further maximally suppressed by the closed-loop control.

Operation of the feedforward path can be explained as follows: If there is an increase of the supply voltage (VDD) that would cause the charge-pump (100) to increase the high voltage (HV), the feedforward compensation signal that is inversely proportional to the increase of the supply voltage (VDD) is summed with the feedback signal for forming the control signal such that the VCO frequency is reduced on basis of the control signal and thus the frequency of the clock signals used for operating the charge-pump (100) is also reduced. This change in the frequency of the clock signals (CK) decreases the high voltage (HV) generated by the charge-pump (100), thus compensating the change in the high voltage (HV) due to the increase in the supply voltage (VDD). Correspondingly, if a decrease of the supply voltage (VDD) would cause the charge-pump (100) to decrease the high voltage (HV), the feedforward compensation signal that is made inversely proportional to the decrease of the supply voltage (VDD) is summed with the feedback signal for forming the control signal so that the VCO frequency is increased on basis of the control signal and thus the frequency of the clock signals (CK) used for operating the charge-pump is also increased. Thus, the feedforward compensation signal causes an increase in the high voltage (HV) of the charge-pump (100) by increasing the VCO frequency. As a result, effect of variation (ripple) in the supply voltage (VDD) on the high voltage (HV) is significantly reduced by the feedforward signal fed into the VCO as part of the control signal, on a broad range of frequencies.

Figure 5:
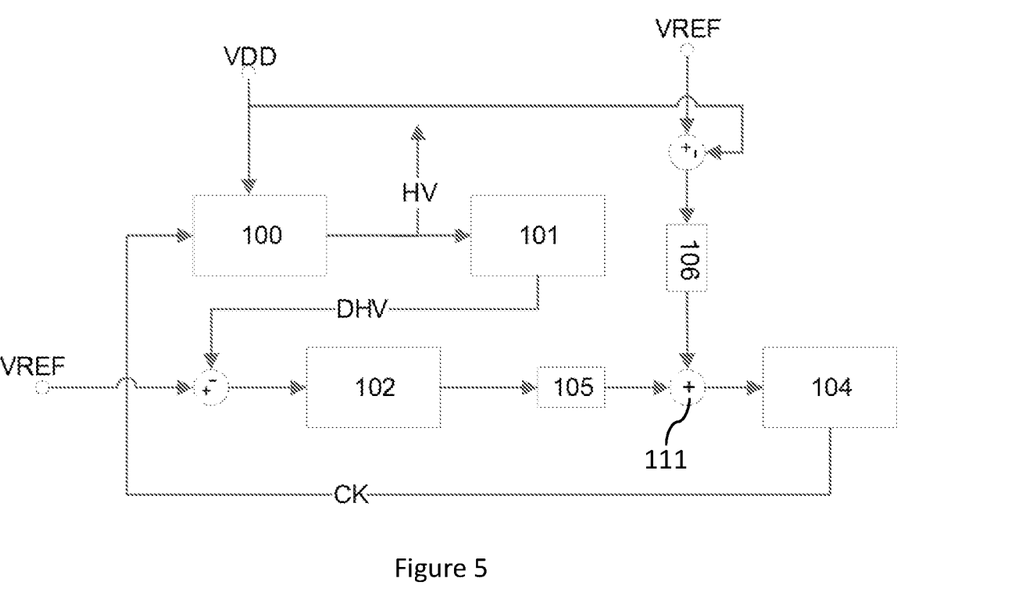
FIG. 5 shows a second embodiment of the charge-pump circuitry.

FIG. 5 illustrates a high-level schematic of a charge-pump circuitry according to a second embodiment.

In comparison to the embodiment shown in the FIG. 4, this embodiment utilizes a current-controlled oscillator, ICO (104). The operating principle of the feedforward path is, however, the same. Supply voltage (VDD) is connected to the feedforward path such that a change in the supply voltage (VDD) affects the ICO (104) frequency but with inverted polarity in comparison to how respective change in the supply voltage (VDD) affects the charge-pump properties.

The feedforward path provides a feedforward compensation signal that is dependent, but inversely proportional to the difference between the supply voltage (VDD) and the second reference voltage (VREF2), to be fed at the control input of the current controlled oscillator, ICO (104). The supply voltage (VDD) is compared in the feedforward path to a second reference voltage (VREF2) such that effectively the supply voltage (VDD) is summed with the second reference voltage (VREF2) with inverted polarity. The feedforward compensation signal is then generated by changing voltage difference between the supply voltage (VDD) with ripple and the second reference voltage (VREF2) without ripple into a current in a second transconductance block (106).

The feedback signal provided by the feedback loop is also converted into a current form in a first transconductance block (105). The feedforward compensation signal, now a current, is summed with the feedback signal in a summing element (111) for forming the control signal, before the control signal is provided at the control input of the current controlled oscillator (104).

As a result, the feedforward compensation signal affects the ICO (104) frequency as part of the control signal, but the effect of the feedforward compensation signal has inverted polarity in comparison to how the supply voltage (VDD) affects the charge-pump (100) properties and thus the generated high voltage (HV). Thus, any ripple or other variation in the supply voltage (VDD) is taken into account in the ICO (104) frequency and thus in the charge-pump (100) clock frequency.

Figure 6:
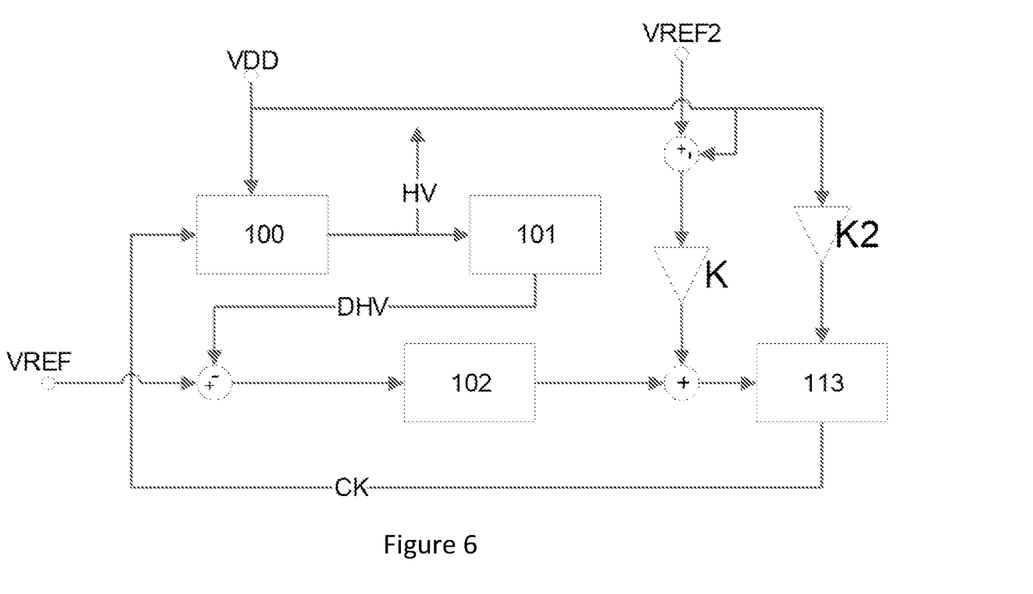
FIG. 6 shows a third embodiment of the charge-pump circuitry.

FIG. 6 illustrates a third embodiment of the invention. In this embodiment, the feedforward path is further enhanced by providing a relaxation oscillator as the VCO (113). For further improving PSRR capability, hysteresis of the VCO (113) is made dependent on the supply voltage (VDD) such that the frequency of the VCO (113) becomes inversely proportional to the supply voltage (VDD). A scaling element (K2) may be provided between the supply voltage (VDD) and the VCO (113) for scaling the supply voltage (VDD) before feeding it towards the VCO (113) for adjusting its hysteresis. In a further embodiment, the control loop with feedforward path may be implemented using a relaxation oscillator implemented as a current-controlled oscillator, ICO, thereby replacing at least the scaling element K in the FIG. 6 with a transconductance element and transforming the feedback signal provided by the controller into a current signal by a transconductance element as shown in the FIG. 5.

As known in the art, a comparator may be used in the VCO (113) for generating a clock signal out of an oscillation signal generated within the VCO (113). The comparator compares an oscillating voltage generated within the VCO (113) to predefined reference voltages, and the output of the comparator is switched from high to low or from low to high, when the oscillating voltage falls below or rises above the respective reference voltages. Hysteresis of the VCO (113), more precisely of the comparator of the VCO (113) that generates the clock signal, may be made dependent on the supply voltage (VDD) by making the reference voltage at the input of the comparator inversely proportional of the supply voltage (VDD). This can be achieved for example with a resistor arrangement, familiar from a traditional relaxation oscillator implementation, at the reference input of the comparator as shown in the FIG. 7.

Figure 7:
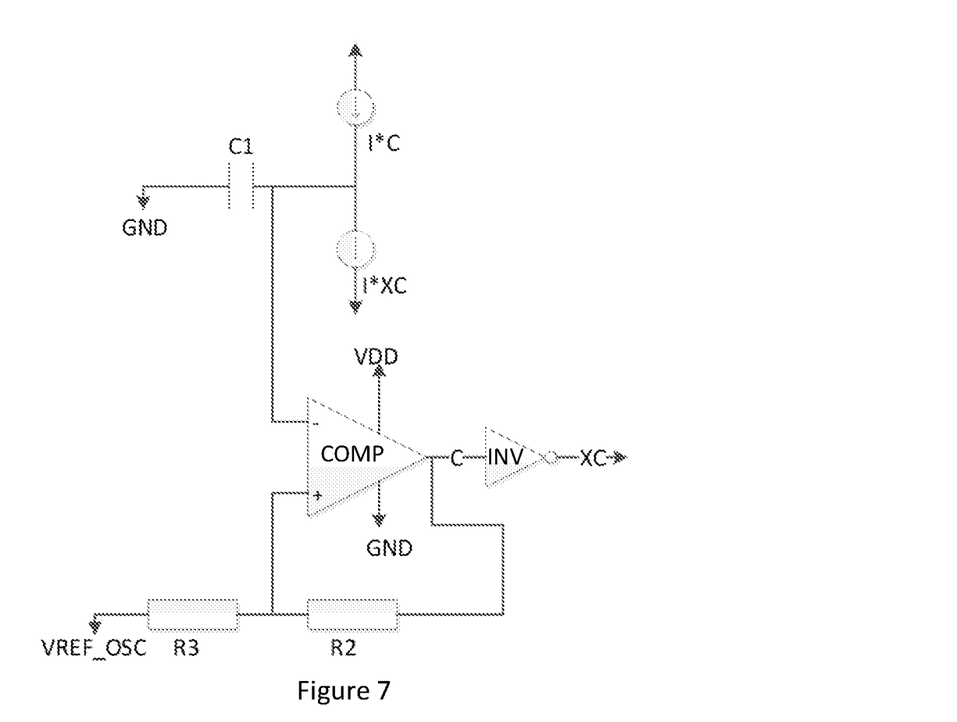
FIG. 7 shows an exemplary embodiment of causing a supply-voltage dependent hysteresis in a comparator of a VCO.

In the FIG. 7, an exemplary comparator circuitry is shown that has hysteresis that is inversely proportional of the supply voltage. Capacitor C1 represents output of the oscillating circuitry of the oscillator. Voltage at the capacitor (C1) electrode connected to the current sources is compared by the comparator (COMP) to a reference voltage, which is obtained on basis of the supply voltage (VDD), including any ripple comprised in the supply voltage. The comparator (COMP) input common-mode level may be controlled by a reference voltage (VREF_OSC). The common-mode level control, though it does not affect the hysteresis at the comparator (COMP) input, offers a way to ease comparator design. Hysteresis of the comparator (COMP) is defined by equation $VDD*R3/(R2+R3)$. At the output of the comparator (COMP) a first clock signal (C) is received and an inverter (INV) generates a second clock signal (XC) with opposite phase to that of the first clock signal (C). Current sources (I*C, I*XC) are needed for supplying current to the capacitor (C1) at the input of the comparator. Here the clock signals C and XC are assumed to either enable the current I or zero it, so that current integrated into the capacitor (C1) is independent of the output swing of the comparator (COMP) and/or the inverter (INV). Thus, the output voltage of the comparator (COMP), essentially dependent on the supply (VDD), does not scale the current (I) magnitude and the wanted changes in the clock frequency due to changes in the comparator circuitry hysteresis are achieved. For example, the current sources (I*C, I*XC) provide current to the capacitor (C1) at the input of the comparator (COMP) so that when, the supply voltage (VDD) increases, respectively the hysteresis increases and consequently clock frequency decreases, the current (I) is kept unaffected by the voltage level of the clock signals (C, and XC) so that the frequency decrease does not become canceled due to the change in the slew-rate of the capacitor (C1) voltage. For example, the scaling element K in the FIG. 6 may be used to create the supply effect in the current (I) in the direction of cancelling the high-voltage (HV) dependence on the supply voltage (VDD).

Speed of the comparator in the VCO is another design parameter to consider. If the comparator is slow, in other words it reacts to reaching of a threshold voltage with a delay, it is more robust and capable of suppressing risk of ringing caused by high-frequency ripple. On the other hand, a slow comparator has more significant hysteresis, since an increased share of the oscillation cycle is caused by delay, and, consequently, a decreased share of a supply voltage dependent hysteresis.

Figure 8:
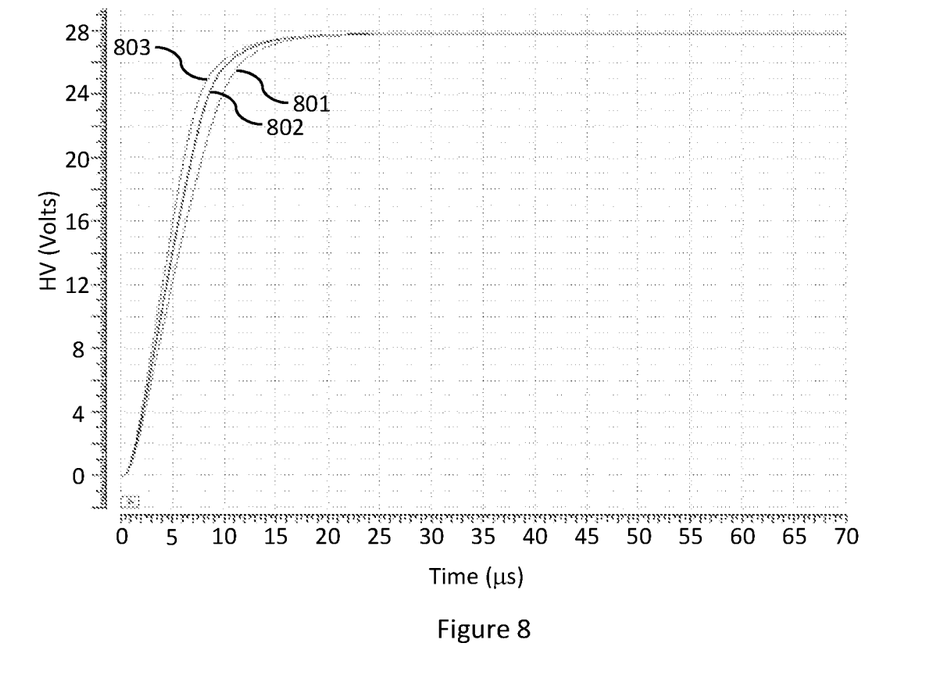
FIG. 8 illustrates establishment of high voltage after start-up.

FIG. 8 illustrates high voltage at the output of the high voltage generating circuitry according to the embodiments after start-up of the high voltage circuitry. High voltage builds up at the output of the charge-pump during first few tens or hundreds of clock cycles. Feedback control circuitry alone enables relatively accurate high voltage independent of the actual supply voltage (VDD) variations. Three curves shown in the FIG. 8 represent high voltage (HV) provided at the output of the charge-pump with supply voltages with DC levels of 3V (801), 3.3V (802) and 3.6V (803) produced by a circuitry with both the feedback control circuitry and a feedforward path.

Figure 9:
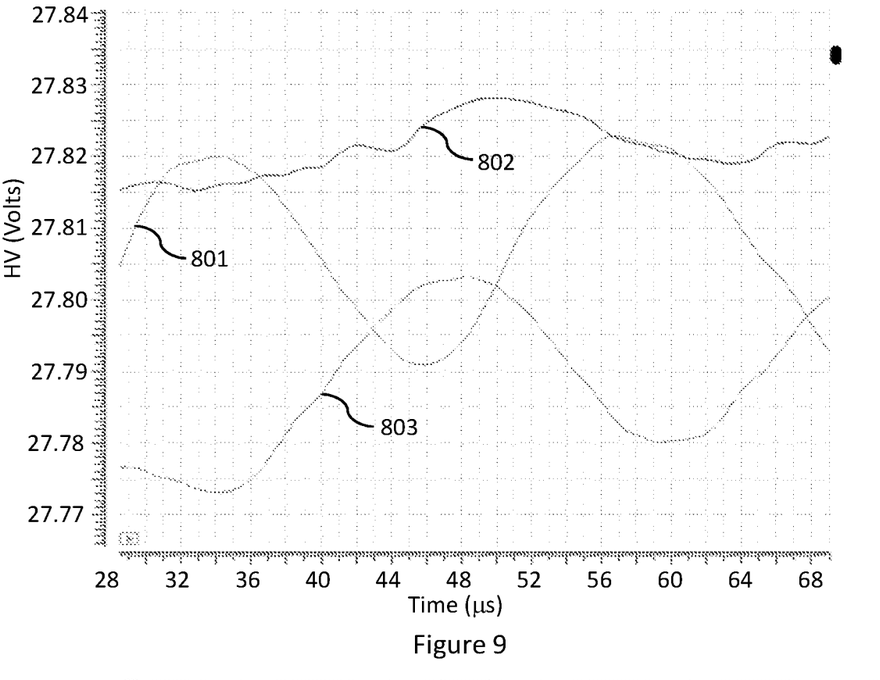
FIG. 9 illustrates ripple in the high voltage in dependence of DC variation in the supply voltage.

FIG. 9 illustrates the same high voltages at the output of the high voltage generating circuitry as the FIG. 8, but now zoomed to show DC level variation due to differences in the supply voltage (VDD) and the ripple of the high voltage due to ripple in the supply voltage (VDD). As in the FIG. 8, high voltages (HV) generated using three different supply voltage (VDD) DC levels, 3.0 V (801), 3.3 V (802) and 3.6 V (803) are shown, which corresponds to a 18% change in the supply voltage DC level. Resulting DC variation of the high voltage (HV) is only about 60 mV, corresponding to only about 0.22% of the high voltage (HV) of approximately 28 V.

In addition to variation of the DC level of the supply voltage, a 200 mV peak-to-peak ripple was introduced in the supply voltage at frequency of 40 kHz. Ripple suppression provided with help of the feedforward path causes that due to such ripple in the supply voltage, a much smaller ripple is present in the high voltage (HV), varying between approximately 10 mV with nominal 3.3 V supply voltage level and approximately 30 mV with 3.0 V supply voltage.

Figure 10:
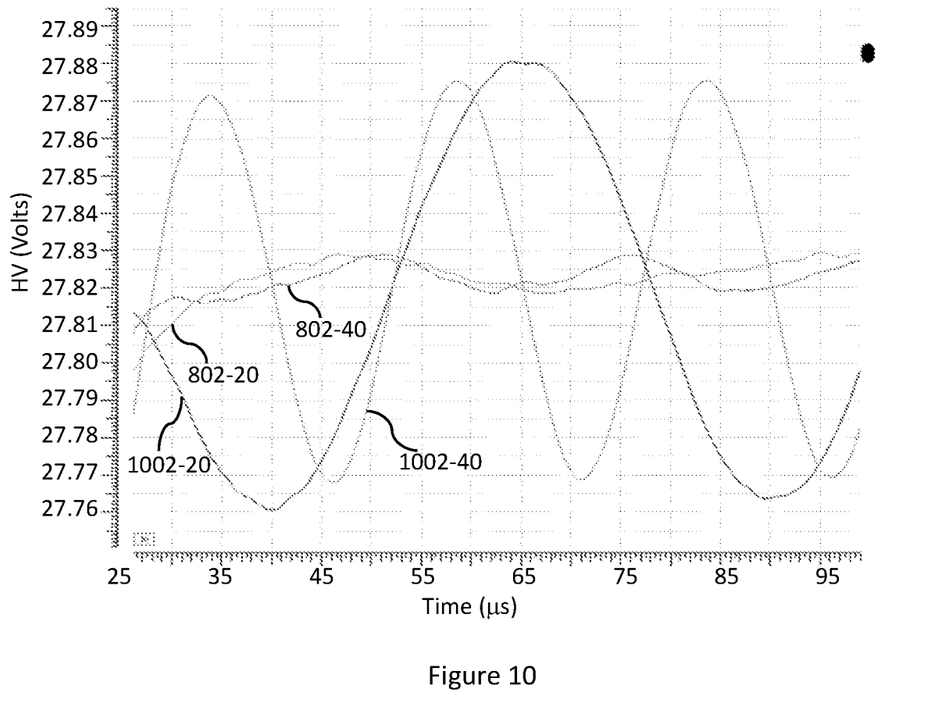
FIG. 10 illustrates effect of the improved control loop on two exemplary ripple frequencies.

FIG. 10 further illustrates high voltage (HV) generated using supply voltage (VDD) at nominal DC level of 3.3V, with AC ripple of 200 mV (peak-to-peak) in the supply voltage with two different ripple frequencies, 20 kHz and 40 kHz. Resulting high voltages (HV) received at the output of the charge-pump are shown both without the feedforward path (1002-20, 1002-40) and with the feedforward path (802-20, 802-40) added. Improvement of the PSRR is significant. With the feedforward path, approximate peak-to-peak ripple in the high voltage (HV) decreases with a factor of ten, in other words ripple in the high voltage (HV) decreases into about one tenth of the ripple in the high voltage (HV) with only the feedback control loop.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A high voltage generating circuitry comprising:
   a charge-pump configured to generate a high voltage based on a supply voltage and to provide the high voltage at its output; and
   a control loop configured to control operation the charge-pump, the control loop comprising:
      a voltage divider configured to receive at its input the high voltage and to provide at its output a divided high voltage,
      a first circuit element configured to provide a first voltage difference signal generated on basis of a comparison between a first reference voltage and the divided high voltage,
      a controller configured to generate a feedback signal on basis of the first voltage difference signal, and
      a voltage- or current-controlled oscillator, referred to as the oscillator, configured to generate clock signals for operating the charge-pump circuitry, wherein frequency of said clock signals generated by the oscillator is configured to be adjusted with a control signal;
   wherein the control loop further comprises a feedforward path comprising:
      a second circuit element configured to combine a second reference voltage and a second voltage generated by inverting the supply voltage for obtaining a second voltage difference signal,
      a third circuit element configured to generate, on basis of the second voltage difference signal, a feedforward compensation signal that is inversely proportional to a voltage difference between the supply voltage and the second reference voltage, and
      a fourth circuit element configured to generate the control signal by summing the feedback signal and the feedforward compensation signal.

2. The high voltage generating circuitry according to claim 1, wherein the oscillator is a current-controlled oscillator, and wherein the third circuit element is a first transconductance element configured to generate the feedforward compensation signal by transforming the second voltage difference signal from a voltage signal into a current signal, and the control loop further comprises:
   a second transconductance element configured to transform the feedback signal from a voltage signal into a current signal.

3. The high voltage generating circuitry according to claim 1, wherein the oscillator is a voltage-controlled oscillator, and wherein the third circuit element is a first scaling element configured to generate the feedforward compensation signal by scaling the second voltage difference signal.

4. The high voltage generating circuitry according to claim 1, wherein the oscillator is configured as a relaxation oscillator with a hysteresis dependent on the supply voltage, wherein the frequency of the oscillator is configured to increase due to the hysteresis in response to a decrease in the supply voltage, and the frequency of the oscillator is configured to decrease due to the hysteresis in response to an increase in the supply voltage.

5. An integrated circuit comprising the high voltage generating circuitry according to claim 1.

6. The integrated circuit according to claim 5, configured to provide the high voltage for a MEMS circuit.

7. A method for controlling a high voltage generating circuitry, the method comprising:
   generating, by a charge-pump, a high voltage based on a supply voltage and providing the high voltage at the output of the charge-pump; and
   controlling operation of the charge-pump by a control loop, the controlling comprising:
      providing a divided high voltage generated on basis of the high voltage,
      obtaining a first voltage difference signal on basis of a comparison between a first reference voltage and the divided high voltage,
      generating a feedback signal on basis of the first voltage difference signal, and
      generating, by a voltage or current-controlled oscillator, referred to as the oscillator, clock signals for operating the charge-pump circuitry, wherein frequency of said clock signals generated by the oscillator is configured to be adjusted with a control signal;

obtaining a second voltage difference signal by combining a second reference voltage and an inverted supply voltage;

generating, on basis of the second voltage difference signal, a feedforward compensation signal that is inversely proportional to a voltage difference between the supply voltage and the second reference voltage;

generating the control signal by summing the feedback signal and the feedforward compensation signal, and adjusting frequency of said clock signals generated by the oscillator with the control signal.

8. The method according to claim 7, wherein the oscillator is a current-controlled oscillator, and wherein the method further comprises:

transforming the feedback signal from a voltage signal into a current signal; and generating the feedforward compensation signal by transforming the second voltage difference signal into a current signal.

9. The method according to claim 7 wherein the oscillator is a voltage-controlled oscillator, and the method further comprises:

providing the feedback signal as a voltage signal; and generating the feedforward compensation signal by scaling the second voltage difference signal.

10. The method according to claim 7, wherein the method further comprises:

controlling hysteresis of the oscillator implemented as a relaxation oscillator with the supply voltage, wherein the hysteresis of the relaxation oscillation is dependent on the supply voltage, such that the frequency of the oscillator is increased due to the hysteresis in response to a decrease in the supply voltage, and the frequency of the oscillator is decreased due to the hysteresis in response to an increase in the supply voltage.

11. The method according to claim 7, performed by an integrated circuit.

* * * * *